United States Patent
Lee et al.

(10) Patent No.: US 12,375,076 B2
(45) Date of Patent: Jul. 29, 2025

(54) LEAKAGE CURRENT COMPENSATION

(71) Applicant: NXP B.V., Eindhoven (NL)

(72) Inventors: Jang Hyuck Lee, Sungnam-si (KR); Jin Hui Lee, Nam-yang-ju-si (KR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/296,249

(22) Filed: Apr. 5, 2023

(65) Prior Publication Data
US 2024/0340000 A1   Oct. 10, 2024

(51) Int. Cl.
*H03K 17/16*   (2006.01)

(52) U.S. Cl.
CPC .................................... *H03K 17/16* (2013.01)

(58) Field of Classification Search
CPC ..................................................... H03K 17/16
See application file for complete search history.

(56) References Cited

U.S. PATENT DOCUMENTS

| | | |
|---|---|---|
| 10,461,629 B2 | 10/2019 | Rommel et al. |
| 2004/0130378 A1 | 7/2004 | Kihara |
| 2008/0203983 A1 | 8/2008 | Lo Lacono et al. |
| 2020/0091813 A1 | 3/2020 | Rommel |
| 2020/0310478 A1 * | 10/2020 | Azevedo ............. H03F 3/45183 |
| 2021/0025923 A1 | 1/2021 | Tornila Oliver |

FOREIGN PATENT DOCUMENTS

| | | |
|---|---|---|
| JP | 2010211721 A1 | 9/2010 |
| TW | I688951 B   * | 3/2020 |

* cited by examiner

*Primary Examiner* — Metasebia T Retebo

(57) ABSTRACT

A current leakage limit circuit connected to a circuit with current leakage and a leakage compensation circuit includes a first current mirror with a first transistor and a second transistor and a current source connected to the first transistor. The second transistor is connected between the circuit and the leakage compensation circuit and limits a compensation current flowing between the circuit and the leakage compensation circuit. The current flowing from the current source through the first transistor limits the current flowing through the second transistor.

13 Claims, 5 Drawing Sheets

LEAKAGE CURRENT COMPENSATION

FIELD OF THE DISCLOSURE

Various exemplary embodiments disclosed herein relate to leakage current compensation for example in a switching regulator.

BACKGROUND

Circuits with high power transistors are subject to current leakage in the high power transistor. This leakage current increases with temperature. When the high power transistor with current leakage is connected to an output of the circuit the current leakage may become great enough to damage other circuits attached to the output. Accordingly, current leakage compensation may be used to decrease the current leakage in the power transistor.

SUMMARY

A summary of various exemplary embodiments is presented below.

Various embodiments relate to a current leakage limit circuit connected to a circuit with current leakage and a leakage compensation circuit, including: a first current mirror with a first transistor and a second transistor; and a current source connected to the first transistor, wherein the second transistor is connected between the circuit and the leakage compensation circuit, wherein the second transistor limits a compensation current flowing between the circuit and the leakage compensation circuit, and wherein a current flowing from the current source through the first transistor limits a current flowing through the second transistor.

Various embodiments are described, further including a third transistor connected in series with the first transistor, wherein a gate of the third transistor is connected to the leakage compensation circuit.

Various embodiments are described, further including a third transistor connected in series with the first transistor, wherein a gate of the third transistor is connected to gates of transistors in a second current mirror in the leakage compensation circuit.

Various embodiments are described, wherein the first transistor has an area different from an area of the second transistor to scale a current flowing through the second transistor and wherein the area of the first transistor is substantially the same as an area of a transistor of the second current mirror.

Further various embodiments relate to a circuit, including: a transistor circuit including a first power transistor, wherein the first power transistor is configured to produce a leakage current at an output of the transistor circuit; a leakage compensation circuit configured to compensate for the leakage current at the output of the transistor circuit; and a current leakage limit circuit connected to the transistor circuit and the leakage compensation circuit including: a first current mirror with a first transistor and a second transistor; and a current source connected to the first transistor, wherein the second transistor is connected between the circuit and the leakage compensation circuit, wherein the second transistor limits a compensation current flowing between the circuit and the leakage compensation circuit, and wherein a current flowing from the current source through the first transistor limits a current flowing through the second transistor.

Various embodiments are described, wherein the current leakage limit circuit further includes a third transistor connected in series with the first transistor, wherein a gate of the third transistor is connected to the leakage compensation circuit.

Various embodiments are described, wherein the current leakage limit circuit further includes a third transistor connected in series with the first transistor, wherein a gate of the third transistor is connected to gates of transistors in a second current mirror in the leakage compensation circuit.

Various embodiments are described, wherein the first transistor has an area different from an area of the second transistor to scale a current flowing through the second transistor and wherein the area of the third transistor is substantially the same as an area of a transistor of the second current mirror.

Various embodiments are described, wherein the transistor circuit further includes: a second power transistor connected in series with the first power transistor.

Various embodiments are described, wherein the transistor circuit further includes: an inductor connected between the output of the transistor circuit and a connection between the first power transistor and the second power transistor; and a capacitor connected between the output of the transistor circuit and a ground.

Various embodiments are described, wherein the leakage compensation circuit further includes: a second current mirror with a fourth transistor and a fifth transistor; and a sixth transistor connected in series with the fourth transistor, wherein the fifth transistor is connected in series with the second transistor.

Various embodiments are described, wherein the current leakage limit circuit further includes: a third transistor connected in series with the first transistor, wherein a gate of the third transistor is connected to the gates of the fourth transistor and the fifth transistor.

Various embodiments are described, wherein the first transistor has an area different from an area of the second transistor to scale the current flowing through the second transistor, the area of the third transistor is substantially the same as an area of the fourth transistor, and the fourth transistor has an area different from an area of the fifth transistor to scale the current flowing through the fourth transistor.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of current leakage compensation circuits and systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

High power transistors are used in many different circuits. These high power transistors may produce a leakage current. A current leakage compensation circuit may be used to reduce the effects of this current leakage on the output of the circuit with the high power transistor. As the temperature increases, the leakage compensation current generated by the current leakage compensation circuit increases and the efficiency of the circuit decreases.

To prevent these issues, a limit circuit may be added to the leakage compensation circuit. This limit circuit prevents the leakage compensation current from increasing above a limited value even if the temperature increases. In addition, because the leakage compensation current does not increase above a certain limit, the efficiency of the circuit does not decrease.

Figure 1:
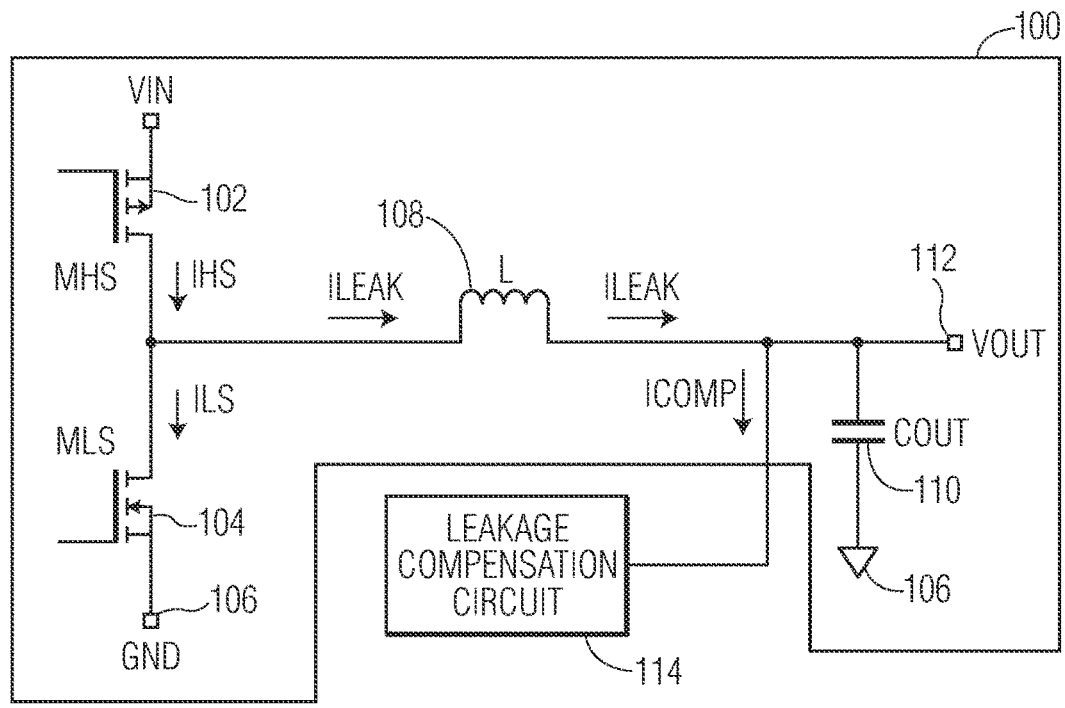
FIG. 1 illustrates leakage current compensation currently in use.

FIG. 1 illustrates leakage current compensation currently in use. In this example a circuit 100 illustrates a portion of a power regulator that includes high side transistor MHS 102, low side transistor MLS 104, inductor L 108, and capacitor COUT 110. A leakage compensation circuit 114 is attached to the output 112 of circuit 100 and draws a compensation current ICOMP from the output to compensate for the leakage current ILEAK generated by the high side transistor MHS 102. When the high side transistor MHS 102 and the low side transistor MLS 104 are off, the difference in the high side leakage current IHS and the low side leakage current ILS is the current ILEAK flowing through the inductor L 108. This current ILEAK increases the output voltage VOUT. The output voltage VOUT will rise without bound as the temperature increases and may cause damage any circuit attached to the output 112 of the circuit 100. The leakage compensation circuit 114 generates the compensation current ICOMP. The compensation current ICOMP subtracts the current ILEAK from the output so that the output voltage VOUT does not increase.

Figure 2:
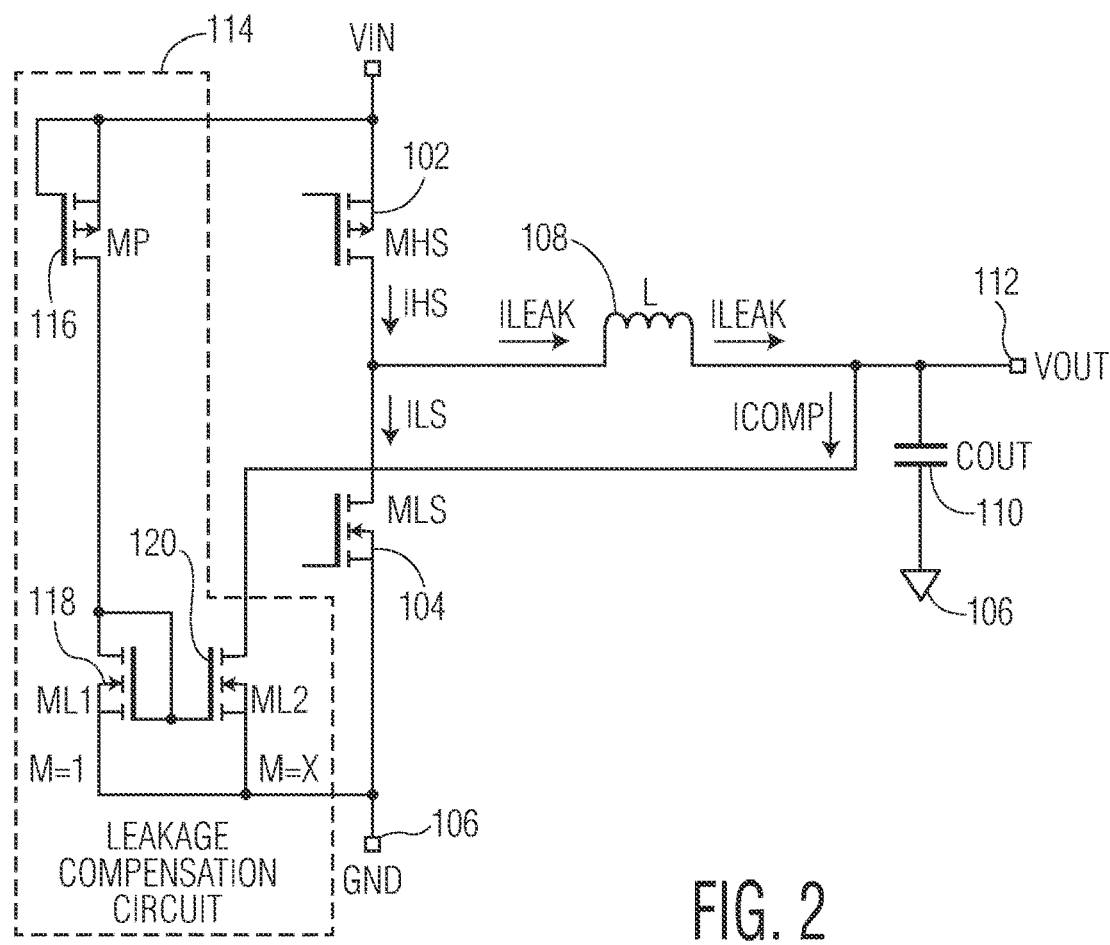
FIG. 2 illustrates an embodiment of the leakage compensation circuit.

FIG. 2 illustrates an embodiment of the leakage compensation circuit 114. The leakage compensation circuit 114 includes transistor MP 116, transistor MN1 118, and transistor MN2 120. Transistor MN1 118 and transistor MN2 120 form a current mirror. Further the areas of transistor MN1 118 and transistor MN2 120 may be selected to scale the currents through transistor MN1 118 and transistor MN2 120. The leakage current ILEAK may be sensed by transistor MP 116 and then mirrored to the current mirror including transistor MN1 118 and transistor MN2 120. The current mirrored to the current mirror is then used to deduct the leakage current ILEAK from the output 112.

Figure 3:
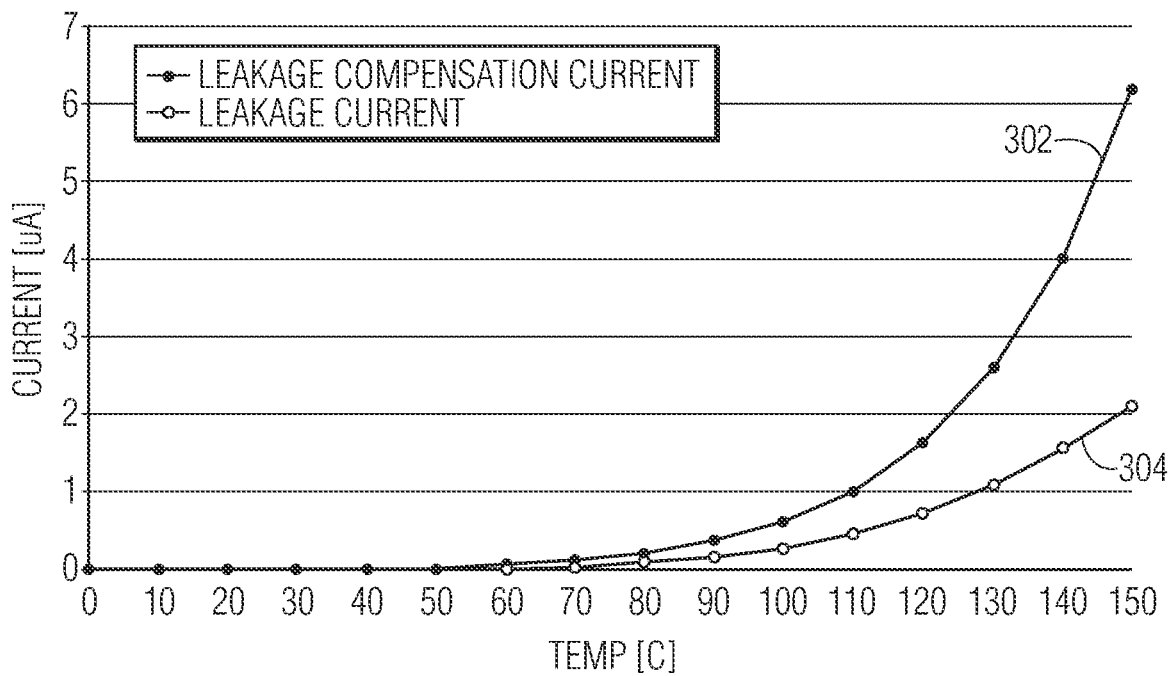
FIG. 3 illustrates a plot of the leakage compensation current ICOMP and leakage current ILEAK as a function of ambient temperature.
Figure 4:
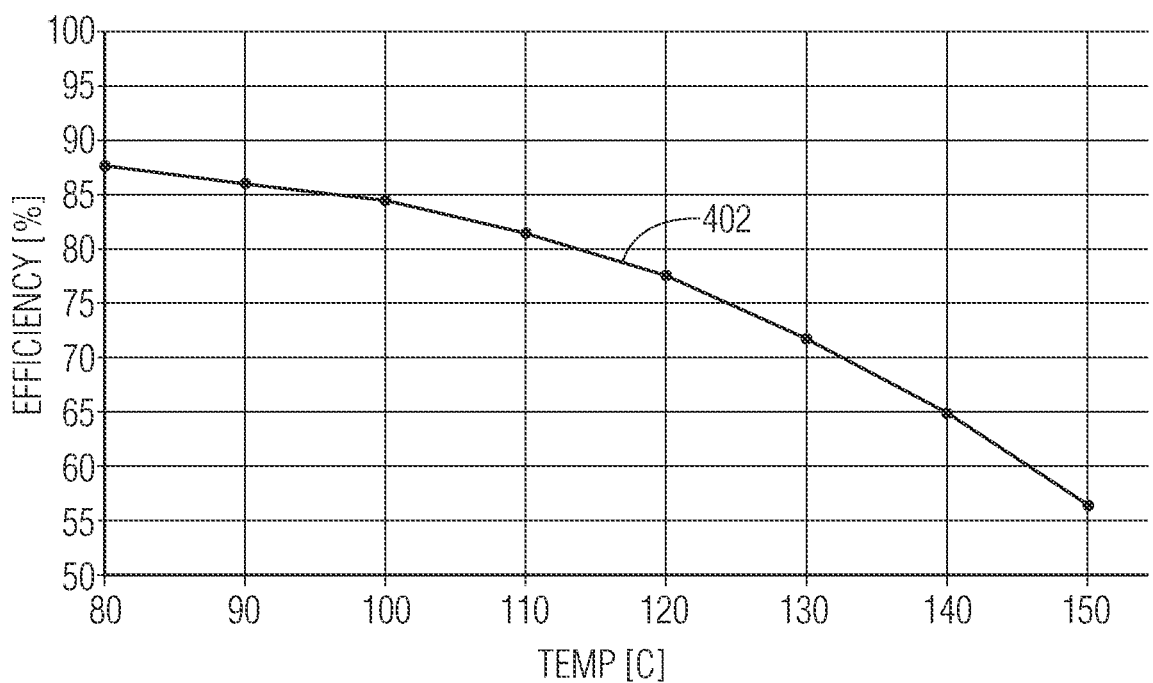
FIG. 4 illustrates a plot of the efficiency of the circuit as a function of ambient temperature.

The leakage compensation circuit 114 is designed according to a worst case process corner with regards to leakage current of the high side transistor MHS 102 and low side transistor MLS 104. Such a design leads to unnecessary power consumption, and as the temperature increases, the power consumption increases. This is because the leakage compensation current is larger than the leakage current. FIG. 3 illustrates a plot of the leakage compensation current ICOMP 302 and leakage current ILEAK 304 as a function of ambient temperature. FIG. 4 illustrates a plot of the efficiency of the circuit as a function of ambient temperature. FIG. 3 illustrates how the difference between leakage compensation current ICOMP 302 and leakage current ILEAK 304 increases with increasing ambient temperature. This causes the leakage compensation circuit 114 to consume increasing power to generate the quickly increasing leakage compensation current ICOMP 302. This leads to a drop in the efficiency of circuit 100 as illustrated in the plot of efficiency 402 in FIG. 4.

Figure 5:
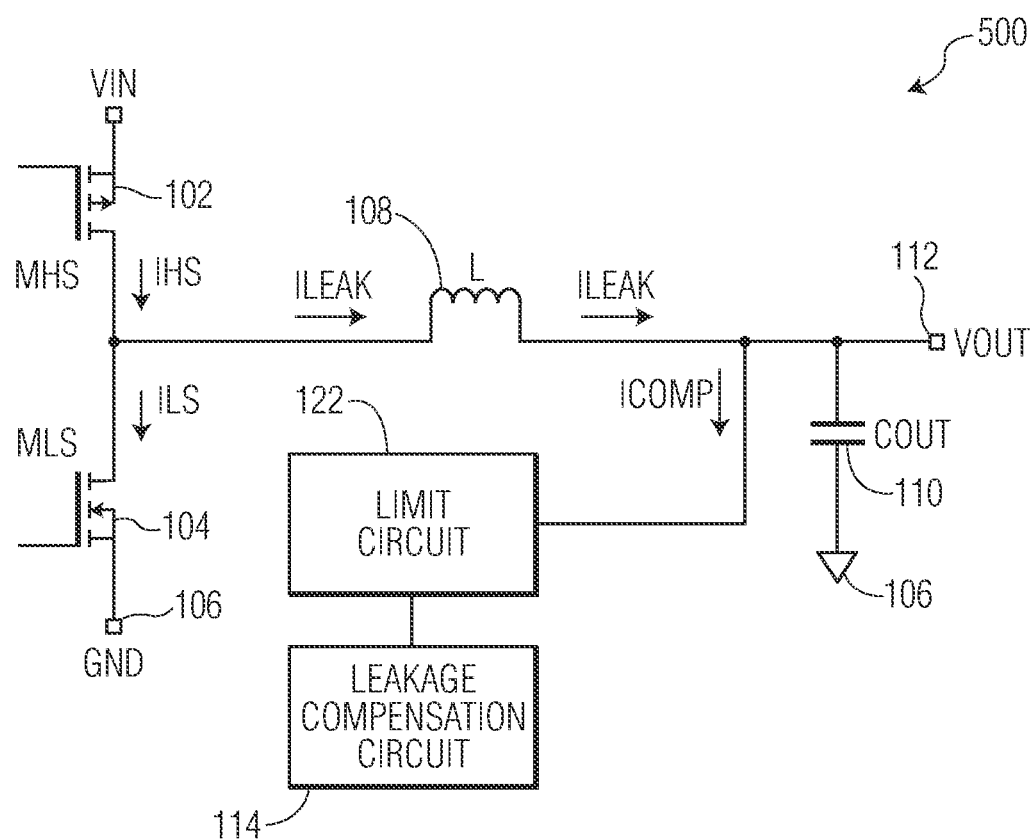
FIG. 5 illustrates an embodiment of a circuit using a limit circuit.

FIG. 5 illustrates an embodiment of a circuit using a limit circuit. The circuit 500 is the same as the circuit 100 in FIGS. 1 and 2 but adds a limit circuit 122. The limit circuit 122 is added to prevent the leakage compensation current ICOMP from increasing above a limit current.

Figure 6:
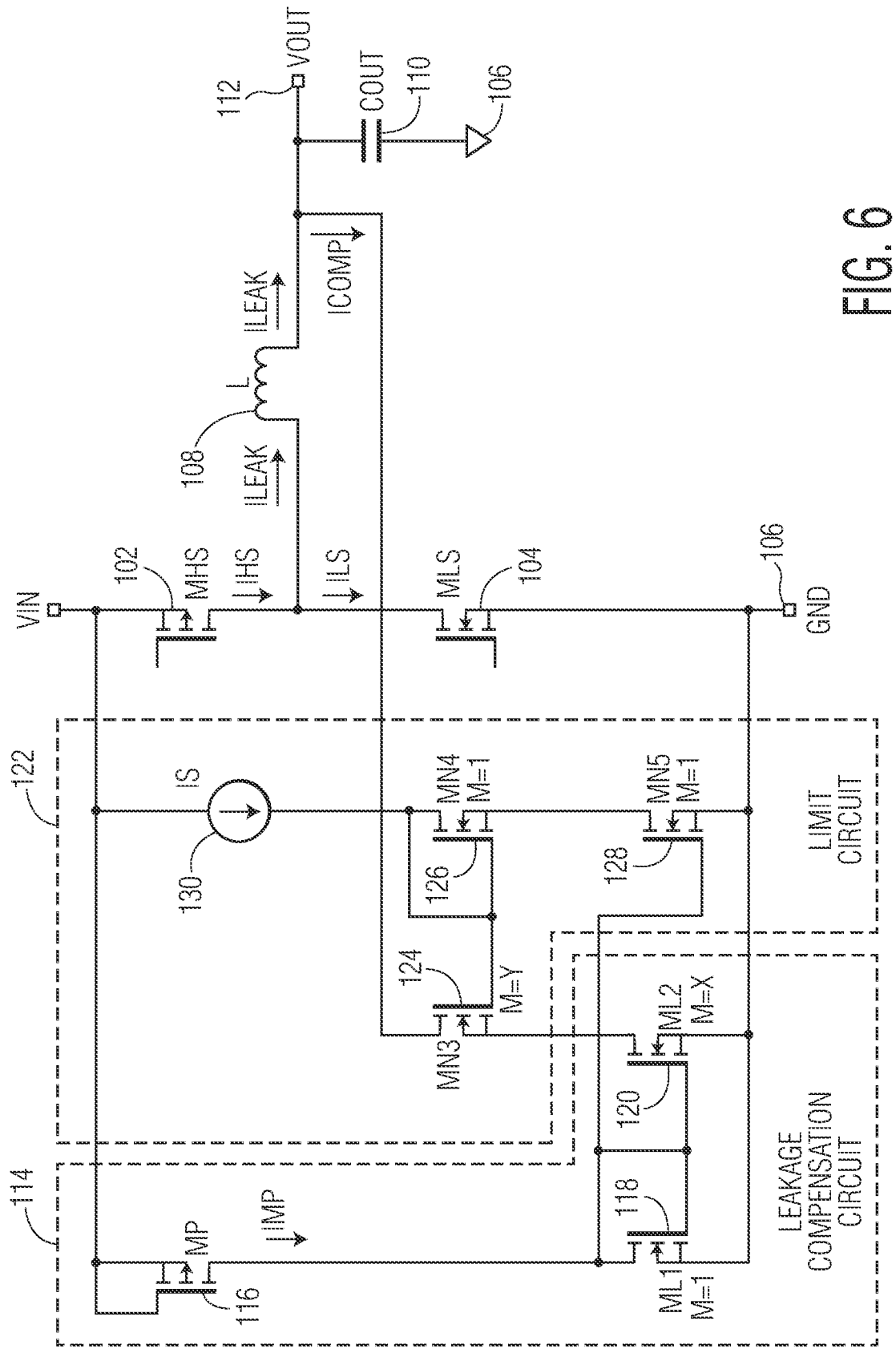
FIG. 6 illustrates a circuit diagram of the circuit with the limit circuit.

FIG. 6 illustrates a circuit diagram of the circuit 500 with the limit circuit 122. The limit circuit 122 includes current source IS 130, transistor MN3 124, transistor MN4 126, and transistor MN5 128. Transistor MN3 124 and transistor MN4 126 form a current mirror. This current mirror receives a current from current source IS 130. The current mirror in combination with the current source IS 130 limits the amount of leakage current ICOMP that can flow through transistor MN3 124. The operation of limit circuit 122 shown in FIG. 6 will now be described. The current IMN2 may be sensed by transistor MP 116 and then mirrored to the current mirror transistor MN1 118 and transistor MN2 120. The current IMN2 is used to deduct the current ILEAK from the output VOUT. The maximum current of IMN2 is limited by limit circuit 122. The transistor MN3 124 is the transistor that limits the maximum current of IMN2. The maximum current of IMN2 limited by the transistor MN3 124 is determined by the area ratio of the transistor MN3 124 and the transistor MN4 126 and the current source IS 130. The transistor MN5 128 is a transistor for removing a current flowing from VIN to ground 106 by current source IS 130 and transistor MN4 126 when no leakage current flows. The current of transistor MN5 128 is determined by the current IMP or the current IS. If the current IMP is less than the current IS, the current of transistor MN5 128 flows the same current as IMP, and if the current IMP is larger than the current IS, the current of transistor MN5 128 flows the same current as IS that limits the compensation current ICOMP.

Figure 7:
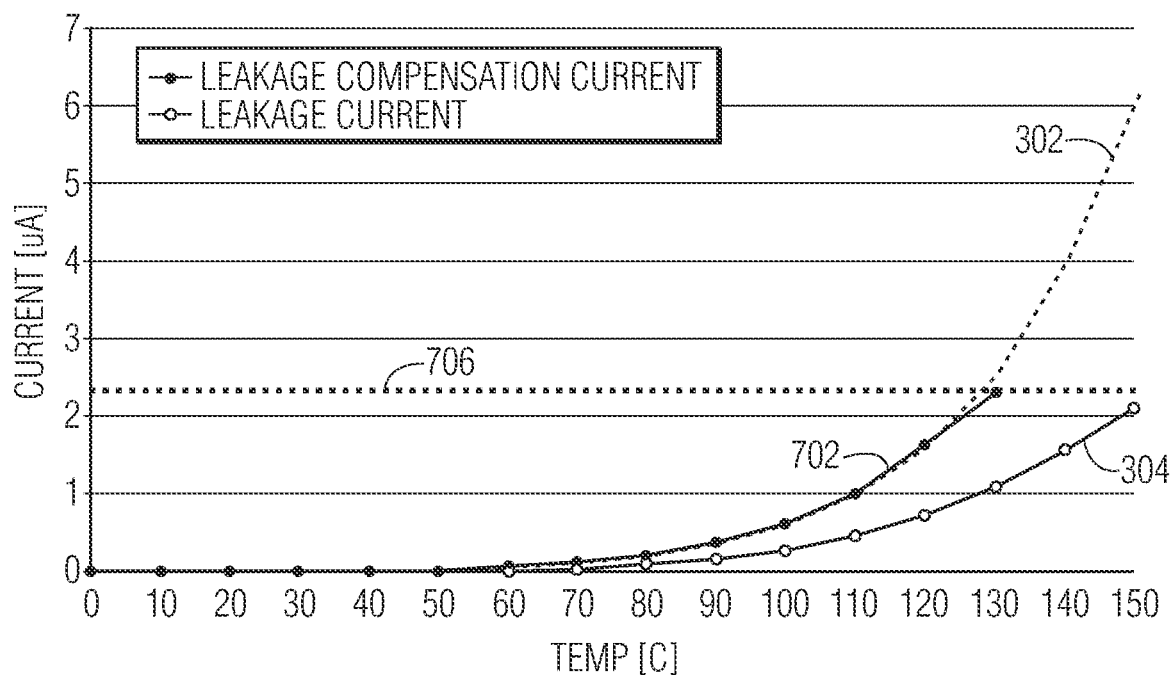
FIG. 7 illustrates a plot of the leakage compensation current and leakage current versus ambient temperature.
Figure 8:
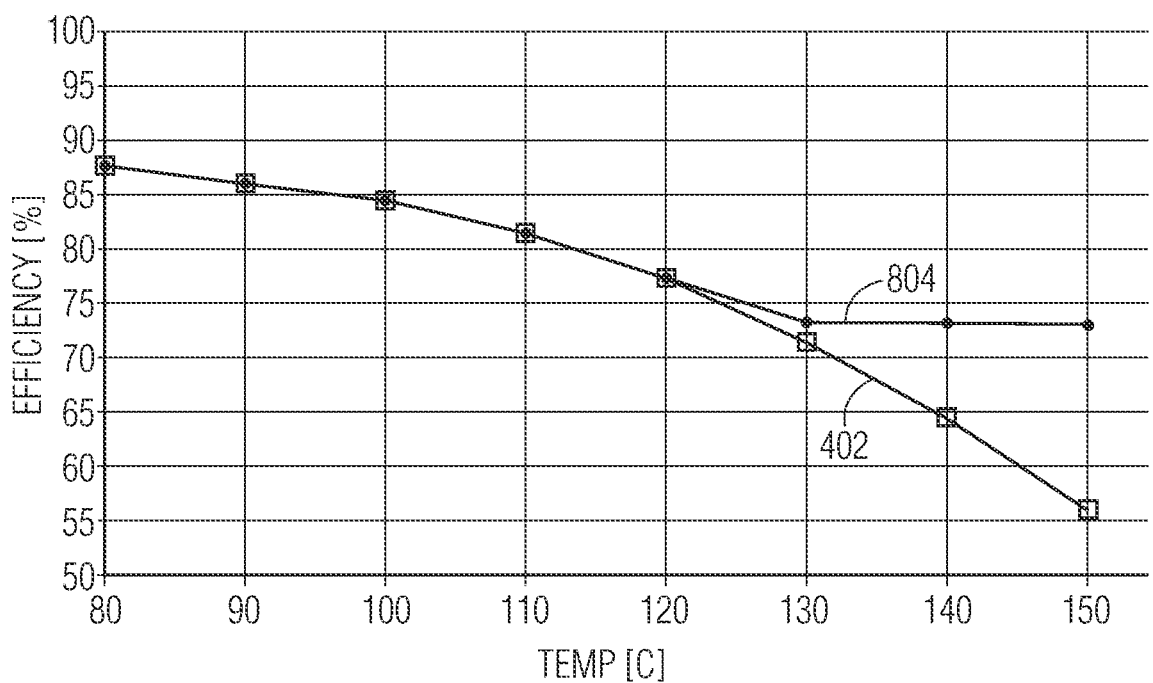
FIG. 8 illustrates a plot of efficiency of the circuit with and without the limit circuit versus ambient temperature.

FIG. 7 illustrates a plot of the leakage compensation current and leakage current versus ambient temperature. If the current IMN2 is less than the limit current in MN3, the compensation current ICOMP 702 has the same current as IMN2. If the current IMN2 is larger than the limit current in transistor MN3 124, the compensation current ICOMP has the same current as the current limited by transistor MN3 124. The plot 706 illustrates the current limit implemented by the limit circuit 122. The plot 302 shows the original compensation current ICOMP without the limit circuit 122 for comparison. As can be seen, the compensation current ICOMP grows until it reaches the limit. FIG. 8 illustrates a plot of efficiency of the circuit with and without the limit circuit 122 versus ambient temperature. The plot 402 shows the efficiency of the circuit 100 without the limit circuit 122. The plot 804 shows the efficiency of the circuit 500 with the limit circuit 122. Once the compensation current limit is reached the efficiency of the circuit is not further reduced because of the limitation on the compensation current ICOMP.

FIG. 6 illustrates one embodiment of the of the limit circuit 122. The limit circuit 122 may take other forms that allow for the compensation current ICOMP to be limited. Further, the limit circuit 122 is shown as applied to a power regulator. The limit circuit 122 may be applied to other circuits that have transistors with a leakage current that needs to be compensated.

The foregoing disclosure provides illustration and description but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, the term "non-transitory machine-readable storage medium" will be understood to exclude a transitory propagation signal but to include all forms of volatile and non-volatile memory. When software is implemented on a processor, the combination of software and processor becomes a specific dedicated machine.

Because the data processing implementing the embodiments described herein is, for the most part, composed of electronic components and circuits known to those skilled in the art, circuit details will not be explained in any greater extent than that considered necessary as illustrated above, for the understanding and appreciation of the underlying concepts of the aspects described herein and in order not to obfuscate or distract from the teachings of the aspects described herein.

Unless stated otherwise, terms such as "first" and "second" are used to arbitrarily distinguish between the elements such terms describe. Thus, these terms are not necessarily intended to indicate temporal or other prioritization of such elements.

It should be appreciated by those skilled in the art that any block diagrams herein represent conceptual views of illustrative hardware embodying the principles of the aspects.

While each of the embodiments are described above in terms of their structural arrangements, it should be appreciated that the aspects also cover the associated methods of using the embodiments described above.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a–b, a–c, b–c, and a–b–c, as well as any combination with multiples of the same element (e.g., a–a, a–a–a, a–a–b, a–a–c, a–b–b, a–c–c, b–b, b–b–b, b–b–c, c–c, and c–c–c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

The invention claimed is:

1. A current leakage limit circuit, configured to be coupled to a circuit with current leakage and a leakage compensation circuit, comprising:
   a first current mirror including a first transistor and a second transistor; and
   a current source coupled to the first transistor,
   wherein the second transistor is coupled between the circuit with current leakage and the leakage compensation circuit,
   wherein the second transistor is configured to limit a compensation current flowing between the circuit with current leakage and the leakage compensation circuit, and
   wherein the current source and the first transistor are configured to pass a current that limits the compensation current flowing through the second transistor;
   wherein the circuit with current leakage includes,
      a first transistor configured to be coupled to a power source (e.g. VIN) and
      a second transistor configured to be coupled to a reference voltage (e.g. GND); and
   wherein the first transistor and the second transistor in the circuit with current leakage are in series and both coupled to the second transistor in the current leakage limit circuit.

2. The circuit of claim 1, further comprising a third transistor connected in series with the first transistor, wherein a gate of the third transistor is connected to the leakage compensation circuit.

3. The circuit of claim 1, further comprising a third transistor connected in series with the first transistor, wherein a gate of the third transistor is connected to gates of transistors in a second current mirror in the leakage compensation circuit.

4. The circuit of claim 3, wherein the first transistor has an area different from an area of the second transistor to scale a current flowing through the second transistor and wherein the area of the first transistor is substantially the same as an area of a transistor of the second current mirror.

5. A circuit, comprising:
   a transistor circuit including a first power transistor, wherein the first power transistor is configured to produce a leakage current at an output of the transistor circuit;
   a leakage compensation circuit configured to compensate for the leakage current at the output of the transistor circuit; and
   a current leakage limit circuit coupled to the transistor circuit and the leakage compensation circuit including,
   a first current mirror with a first transistor and a second transistor; and
   a current source coupled to the first transistor,
   wherein the second transistor is coupled between the circuit and the leakage compensation circuit,
   wherein the second transistor is configured to limit a compensation current flowing between the circuit and the leakage compensation circuit,
   wherein the current source and the first transistor are configured to pass a current that limits the compensation current flowing through the second transistor; and
   wherein the transistor circuit further includes a second power transistor connected in series with the first power transistor.

6. The circuit of claim 5,
   wherein the current leakage limit circuit further comprises a third transistor connected in series with the first transistor,
   wherein a gate of the third transistor is connected to the leakage compensation circuit.

7. The circuit of claim 5,
   wherein the current leakage limit circuit further comprises a third transistor connected in series with the first transistor,
   wherein a gate of the third transistor is connected to gates of transistors in a second current mirror in the leakage compensation circuit.

8. The circuit of claim 7,
   wherein the first transistor has an area different from an area of the second transistor to scale a current flowing through the second transistor and
   wherein the area of the third transistor is substantially the same as an area of a transistor of the second current mirror.

9. The circuit of claim 5, wherein the transistor circuit further comprises:
   an inductor connected between the output of the transistor circuit and a connection between the first power transistor and the second power transistor; and
   a capacitor connected between the output of the transistor circuit and a ground.

10. The circuit of claim 5, wherein the leakage compensation circuit further comprises:
    a second current mirror with a fourth transistor and a fifth transistor; and
    a sixth transistor connected in series with the fourth transistor,
    wherein the fifth transistor is connected in series with the second transistor.

11. The circuit of claim 10, wherein the current leakage limit circuit further comprises:
    a third transistor connected in series with the first transistor, wherein a gate of the third transistor is connected to the gates of the fourth transistor and the fifth transistor.

12. The circuit of claim 11, wherein
    the first transistor has an area different from an area of the second transistor to scale the current flowing through the second transistor,
    the area of the third transistor is substantially the same as an area of the fourth transistor, and
    the fourth transistor has an area different from an area of the fifth transistor to scale the current flowing through the fourth transistor.

13. A current leakage limit circuit, configured to be coupled to a circuit with current leakage and a leakage compensation circuit, comprising:
    a first current mirror including a first transistor and a second transistor; and
    a current source coupled to the first transistor,
    wherein the second transistor is coupled between the circuit with current leakage and the leakage compensation circuit,
    wherein the second transistor is configured to limit a compensation current flowing between the circuit with current leakage and the leakage compensation circuit, and
    wherein the current source and the first transistor are configured to pass a current that limits the compensation current flowing through the second transistor;

a third transistor connected in series with the first transistor;
wherein a gate of the third transistor is connected to gates of transistors in a second current mirror in the leakage compensation circuit.

* * * * *